(12) United States Patent
Zeller

(10) Patent No.: US 8,044,836 B2
(45) Date of Patent: Oct. 25, 2011

(54) CONTINUOUS TIME SIGMA-DELTA A/D CONVERTER AND ELECTRICAL SYSTEM COMPRISING THE A/D CONVERTER

(75) Inventor: Sebastian Zeller, Grasbrunn (DE)

(73) Assignee: STMicroelectronics Design & Application GmbH, Grassbrunn (DE)

( * ) Notice: Subject to any disclaimer, the term of this patent is extended or adjusted under 35 U.S.C. 154(b) by 0 days.

(21) Appl. No.: 12/610,112

(22) Filed: Oct. 30, 2009

(65) Prior Publication Data

US 2011/0102222 A1    May 5, 2011

(51) Int. Cl.
*H03M 3/00* (2006.01)
(52) U.S. Cl. .......................... 341/143; 341/155
(58) Field of Classification Search .......... 341/144, 341/143, 155
See application file for complete search history.

(56) References Cited

U.S. PATENT DOCUMENTS

| | | | | |
|---|---|---|---|---|
| 6,441,767 | B1 * | 8/2002 | Frazier | 341/155 |
| 6,781,533 | B2 * | 8/2004 | Yap et al. | 341/143 |
| 7,376,400 | B2 * | 5/2008 | Bellaouar et al. | 455/130 |
| 7,439,885 | B2 * | 10/2008 | Jensen | 341/61 |
| 2007/0040718 | A1 * | 2/2007 | Lee | 341/143 |
| 2007/0216562 | A1 * | 9/2007 | Teo et al. | 341/155 |
| 2009/0325632 | A1 * | 12/2009 | Gambini et al. | 455/550.1 |

* cited by examiner

*Primary Examiner* — Peguy Jean Pierre
(74) *Attorney, Agent, or Firm* — Lisa K. Jorgenson; David C. Conlee; Seed IP Law Group PLLC

(57) ABSTRACT

A continuous time sigma-delta analog-to-digital converter comprising: a summator of an input analog signal and a feedback signal; a feed-forward integrator path connected to the summator and configured to provide a digital signal; a feedback digital-to-analog converter to convert the digital signal into a feedback analog signal; a feedback low pass filter structured to filter the feedback analog signal and provide the feedback signal to the summator.

30 Claims, 4 Drawing Sheets

US 8,044,836 B2

CONTINUOUS TIME SIGMA-DELTA A/D CONVERTER AND ELECTRICAL SYSTEM COMPRISING THE A/D CONVERTER

BACKGROUND

1. Technical Field

The present disclosure relates to analog-to-digital converters and, particularly, to continuous time sigma-delta analog-to-digital converters.

2. Description of the Related Art

Delta-Sigma ($\Delta\Sigma$; or sigma-delta, $\Sigma\Delta$) modulation is a technique which has found increasing use in a range of modern electronic components, such as analog-to-digital and digital-to-analog converters. FIG. 1 shows a conventional continuous time sigma-delta analog-to-digital converter provided with an integrator (consisting of an operational amplifier $A_{PA}$ and a feedback capacitor $C_{PA}$), a low pass filter $F_{PA}$, a quantizer $Q_{PA}$, and a feedback path via a current mode digital-to-analog converter $DAC_{PA}$.

A low unit gain bandwidth or low slew rate of the operational amplifier employed by the integrator gives rise to distortion of the feedback signal. Particularly, in case of too low bandwidth the gain of the operational amplifier is too low to suppress the inherent non-linearity of its own transfer characteristic at higher frequencies, while in case of too low slew rate the gain of the operational amplifier becomes dependent on its input signal.

Due to the strong high pass shaping of the quantization noise in sigma-delta analog-to-digital converters, any distortion of the feedback signal results in high frequency noise being mixed with other high frequency noise and further being converted down to low frequency, thereby corrupting the noise shaping and degrading the signal to noise ratio (SNR). Hence for high signal to noise ratio and low distortion a very fast operational amplifier with high power dissipation is required.

BRIEF SUMMARY

The sigma-delta analog-to-digital converters of the prior art techniques require high performance integrators. Particularly, operational amplifiers showing large bandwidth and high slew rate are required.

According to an embodiment, a continuous time sigma-delta analog-to-digital converter is provided which comprises a summator configured to provide a difference signal equal to a difference between an input analog signal and a feedback signal; a feed-forward integrator path connected to the summator and configured to provide a digital signal; a feedback digital-to-analog converter configured to convert the digital signal into a feedback analog signal; and a feedback low pass filter structured to filter the feedback analog signal and provide the feedback signal to the summator.

According to another embodiment an electrical system is provided that comprises a continuous time sigma-delta analog-to-digital converter configured to produce a digital signal and a processing apparatus connected to said analog-to-digital converter and configured to process the digital signal. The analog-to-digital converter includes an input terminal structured to receive an input analog signal and a feedback signal; a feed-forward integrator path connected to the input terminal and configured to provide a digital signal; a feedback digital-to-analog converter configured to convert the digital signal into a feedback analog signal; and a feedback low pass filter structured to filter the feedback analog signal and provide the feedback signal to the input terminal;

These and other aspects will be apparent from and elucidated with reference to the embodiments described hereinafter.

BRIEF DESCRIPTION OF THE SEVERAL VIEWS OF THE DRAWINGS

Further characteristics and advantages will be more apparent from the following description of a preferred embodiment and of its alternatives given as an example with reference to the enclosed drawings in which.

DETAILED DESCRIPTION

Figure 1:
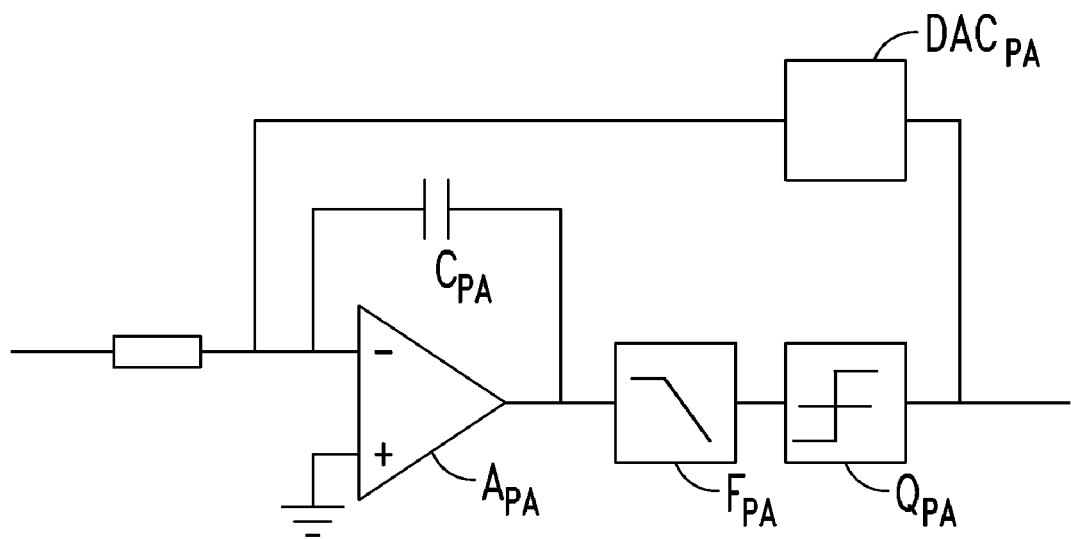
FIG. 1 schematically shows a continuous time sigma-delta analog-to-digital converter in accordance with a prior art technique.
Figure 2:
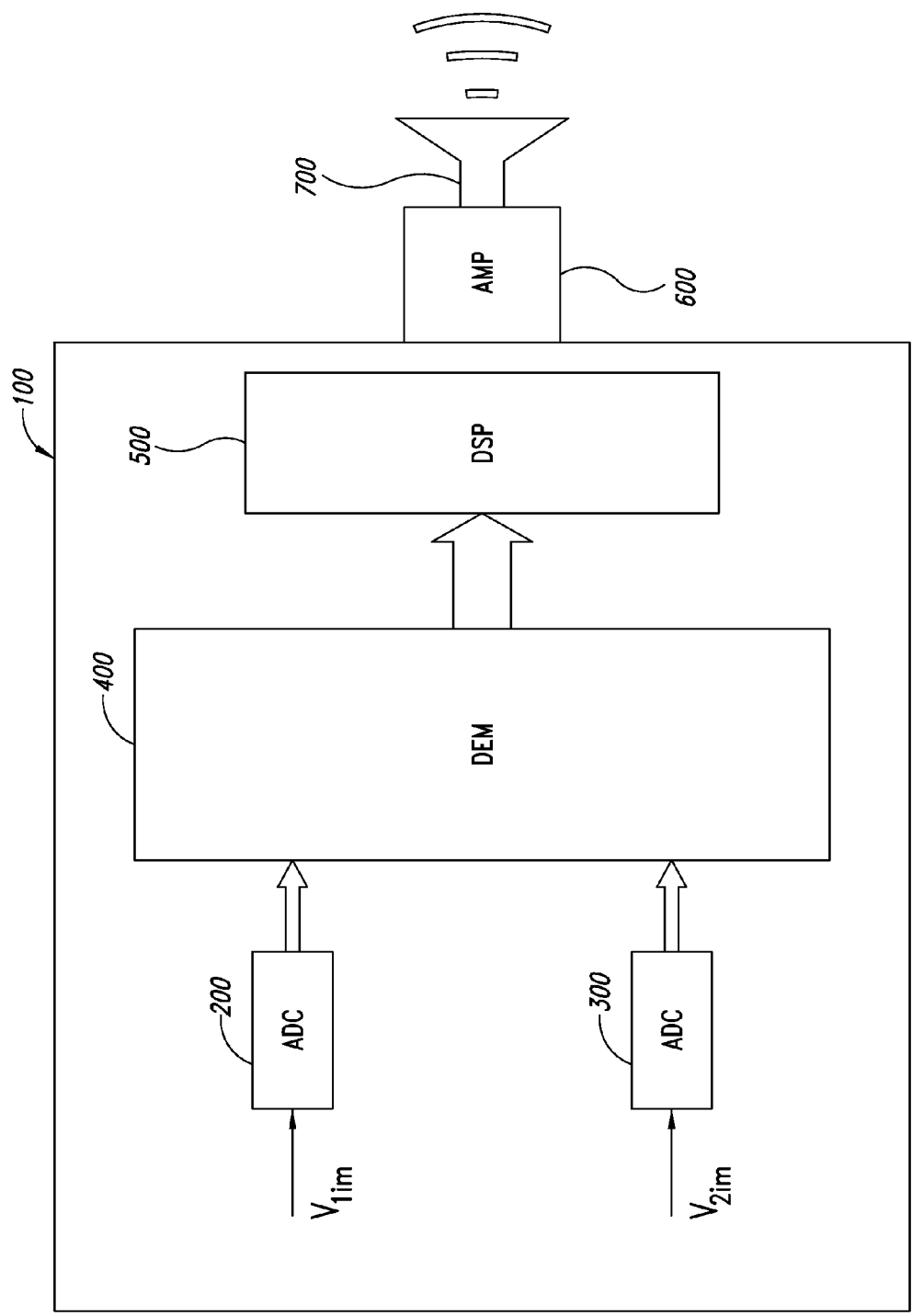
FIG. 2 schematically shows an embodiment of an electrical system including a continuous time sigma-delta analog-to-digital converter.

FIG. 2 schematically shows an electrical system 100 such as a radio tuner system structured to receive radio broadcasts and convert them into audio-frequency signals which can be fed into an amplifier 600 driving a loudspeaker 700. Particularly, the radio tuner system 100 can be a highly integrated tuner which deals with transmissions using different methods of modulation or transmissions techniques, such as: FM (frequency modulation), AM (amplitude modulation) and digital audio broadcasting (DAB). In accordance with a particular example, the radio tuner system 100 can be installed in a vehicle (e.g. a car) radio device.

In addition to further devices known per se, the radio turner system 100 comprises an analog-to-digital converter 200 (ADC) and a further analog-to-digital converter 300 (ADC), a demodulator 400 and a digital signal processor 500 (DSP).

Particularly, each of the above analog-to-digital converter 200 and 300 is a continuous time sigma-delta analog-to-digital modulator and can be structurally and functionally analogous. As an example, the analog-to-digital converter 200 is configured to convert into a first digital signal the "I" component $V_{1in}$ of an analog IQ signal received at an intermediate frequency. According to this example, the further analog-to-digital converter 300 is configured to convert into a second digital signal the "Q" component $V_{2in}$ of the analog IQ signal. The IQ demodulation is performed by the demodulator 400 which provides output digital demodulated signals to the DSP 500 for further processing.

Figure 3:
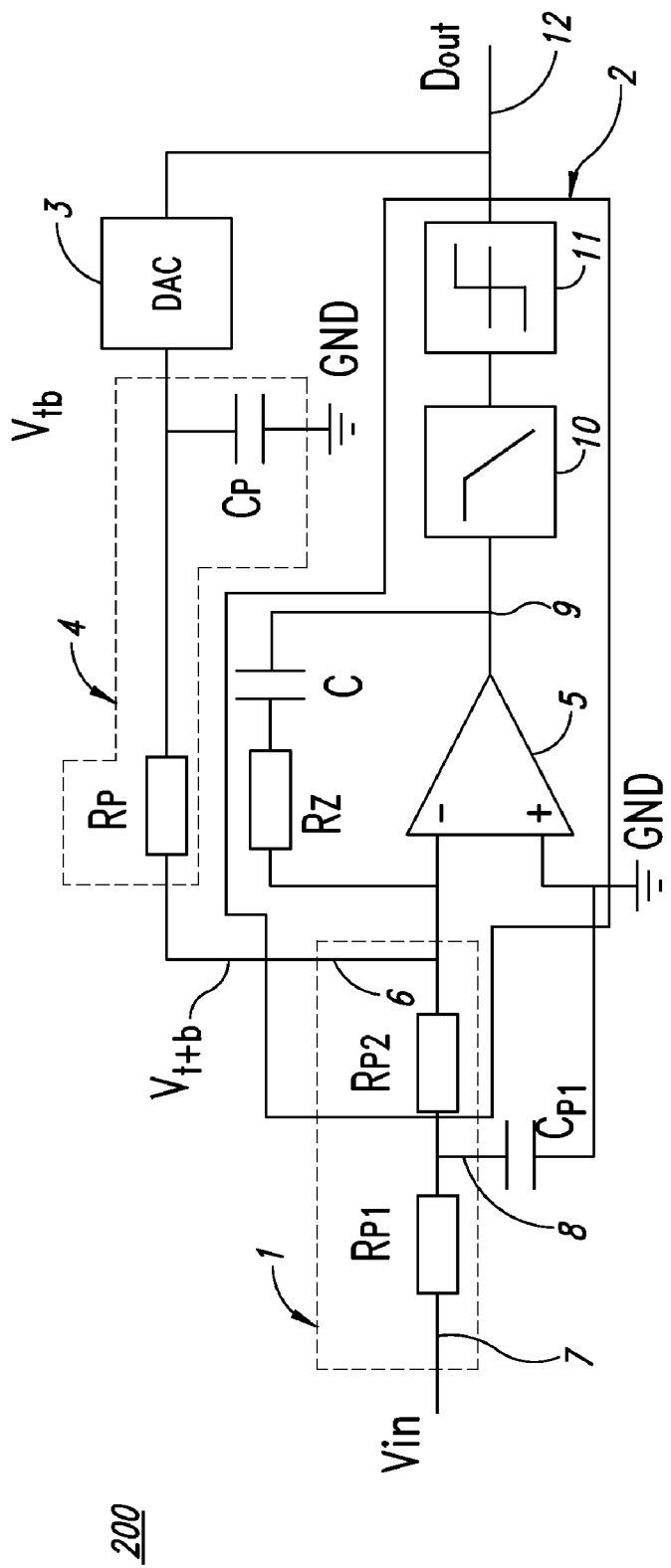
FIG. 3 shows an embodiment of said continuous time sigma-delta analog-to-digital converter.

FIG. 3 schematically illustrates an embodiment of the continuous time sigma-delta analog-to-digital modulator 200 (hereinafter also denoted as ADC converter) which comprises a summator 1, configured to receive an input analog signal $V_{in}$ (e.g. a voltage signal) and a feedback signal $Vff_{fb}$, and a feed-forward integrator path 2 configured to provide a digital signal Dout on a digital output 12. The ADC converter 200 further includes a feedback path provided with a digital-to-analog converter 3 (DAC), configured to convert the digital signal Dout into a feedback analog signal $V_{fb}$, and a feedback low pass filter 4 structured to filter the feedback analog signal $V_{fb}$ and provide the feedback signal $V_{fb}$ to the summator 1. The summator 1 comprises a first terminal 6 for receiving the feedback signal $Vff_{fb}$, a second terminal 7 for receiving the input analog signal $V_{in}$ which can be, according to the system 100 of FIG. 2, the $I^{st}$ component $V_{1in}$ and a third terminal 8.

The feed-forward integrator path 2 comprises an integrator device including an operational amplifier in an integrator configuration. In accordance with the embodiment illustrated in FIG. 3, the integrator device includes an operational amplifier 5 provided with an inverting input "−" connected to the first terminal 6 of the summator 1, a non-inverting input "+" connected to a ground terminal GND and the third terminal 8 of the summator 1 via input capacitor $C_{P1}$, and an amplifier output 9.

Moreover, in accordance with the schematization of FIG. 3, the summator 1 includes a first input resistor $R_{P1}$ connected between the second terminal 7 and a the third terminal 8, and a second input resistor $R_{P2}$ connected between the third terminal 8 and the inverting input of the operational amplifier 5. The feed-forward integrator path 2 also includes a feedback capacitor C having a first terminal connected to the amplifier output 9 and a second terminal connected to the inverting input of the operational amplifier 5 via an electrical link.

This electrical link can be a conductive path or, in accordance with the illustrated embodiment, it can also include a feedback resistor $R_Z$ which is so interposed between the feedback capacitor C and the inverting input of the operational amplifier 5. Moreover, the feed-forward integrator path 2 includes the above mentioned second input resistor $R_{P2}$ and a low pass filter 10 having a respective input connected to the amplifier output 5 and a respective output connected to a quantizer 11.

The feedback low pass filter 4 is, particularly, an RC filter including a filter capacitor having a terminal connected between the output of the digital-to-analog converter 3 and a ground terminal GND. The feedback low pass filter 4 also includes a filter resistor $R_P$ connected to the output of the digital-to-analog converter 3 and the first terminal 6 of the summator 1. The quantizer 11 is provided with an input terminal for a frequency signal $f_{CLK}$ indicating the frequency of a clock signal CLK and can include, as an example, a latched comparator.

The above described embodiment of the ADC converter 200 can be integrated in a semiconductor chip by employing, as an example, the CMOS (complementary metal oxide semiconductor) technology or a BiCMOS (Bipolar CMOS) technology.

In operation, at the inputs of the operational amplifier 5 a signal representing the difference between the input analog signal $V_{in}$ and the feedback signal $V_{fb}$ is supplied. The operational amplifier 5, which is in the above described integrator configuration, accumulates or sums this difference and feeds an integrated analog signal to the low pass filter 10. The integrated and filtered analog signal is then supplied to the quantizer 11 which via a sampling and a quantization produces the digital signal Dout. The frequency signal $f_{CLK}$ supplied to the quantizer 11 determines the data rate of the digital signal Dout, which represents the input analog signal $V_{in}$ plus highpass shaped quantization noise.

The digital signal Dout is then fed to the digital-to-analog converter 3 generating the corresponding feedback analog signal $V_{fb}$ which can correspond to rectangular current pulses or exponentially decaying current pulses. The feedback analog signal $V_{fb}$ is then filtered by the feedback low pass filter 4 which suppresses high frequency components carried by the feedback analog signal $V_{fb}$ so as to produce the feedback signal $V_{ffb}$. This feedback signal $V_{ffb}$ forces the digital signal Dout exiting the ADC converter 200 to track the average of the input analog signal $V_{in}$.

It is observed that the RC feedback low pass filter 4 introduces in the signal transfer function STF of the ADC converter 200 a passive pole p related to the capacitance of the capacitor $C_P$ and the resistance of the filter resistor $R_P$ according to the following expression:

$$p = -1/(RpCp) \quad (1)$$

In the present description electrical parameters (such as, capacitances and resistances) are indicated with the same symbols employed to identify the corresponding electrical components (i.e. resistors and capacitors) in the figures.

It is observed that the passive pole p associated with the feedback low pass filter 4 placed after the digital-to-analog converter 3 reduces considerably the requirements to the bandwidth and slew rate of the operational amplifier 5, because, as already indicated, most of the high frequency components exiting the digital-to-analog converter 3 are already suppressed by feedback low pass filter 4 before they reach the operational amplifier 5.

Moreover, it is observed that the feedback resistor $R_Z$, placed in series to the feedback capacitor C, introduces a zero z in the signal transfer function of the ADC converter 200:

$$z = -1/(RZC) \quad (2)$$

By designing the concerned electrical parameters (resistances and capacitances) so as that the product $R_Z$ C is equal to product RpCp the additional zero z has the effect of compensating the pole p expressed by expression (1) so as to obtain a satisfying loop stability of the ADC converter and a noise transfer function NTF comparable to the ones associated to the prior art solution above described.

The first input resistor $R_{P1}$, the second input resistor $R_{P2}$ and the input capacitor $C_{P1}$ act as an input low pass filter for the input analog signal $V_{in}$ and introduce a further pole $p_P$ which can be expressed as:

$$p_P = -1/(CP_1(RP1//RP2)) \quad (3)$$

wherein $Rp_1//Rp_2$ indicated the total resistance for parallel electric connection:

$$RP1//RP2 = RP_1 RP2/(RP_1 + RP2)$$

By designing the concerned electrical parameters (resistances and capacitances) so that the further pole $p_P$ of expression (3) is equal to the pole p of expression (1), high frequency components passing in the signal transfer function STF can be avoided.

Furthermore, to avoid noise amplification of the thermal noise associated with the filter resistor $R_P$ and the second input resistor $R_{P2}$, the poles $p_P$ and p can be designed to show frequencies that are far outside the usable frequency band range of the ADC converter 200. As an example, in the case of a fifth order ADC converter 200 with a bandwidth of 400 kHz and an oversampling ratio (OSR) of 100 ($f_{CLK}$=40 MHz), the pole $p_P$ could be placed at frequency of 4 MHz. In accordance with this particular example:

RP1=RP2=2 k Ohm; RP=RZ=1 kOhm;
C=$C_P$=$C_{P1}$=40 pF.

With reference to the digital-to-analog converter 3 of FIG. 3, it can be a pulse width modulator, a binary weighted digital-to-analog converter, a ladder network digital-to-analog converter or another type of suitable digital-to-analog converter. Particularly, the digital-to-analog converter 3 can be a ladder network converter operating in the current mode. The current mode technique allows the digital-to-analog converter 3 tolerating voltage swing on its output due to the passive pole p.

In accordance with a particular embodiment, the digital-to-analog converter 3 includes at least a one-bit return-to-zero converter 16 (FIG. 4) which is realized according the current mode technique and can be manufactured in a BiCMOS technology. The one-bit return-to-zero converter 16 comprises a differential pair circuit 13 having, as an example, the common emitter configuration. The differential pair circuit 13 is provided with a first current steering transistor T1 and a second current steering transistor T2 which are both NPN bipolar junction transistors (BJT). Each emitter terminal of the first current steering transistor T1 and the second current steering transistor T2 is connected to an anode of a diode 14 having its cathode connected to the ground GND.

A base terminal of the first current steering transistor T1 is configured to receive the digital signal Dout (indicated in FIG. 4 as signal Dout+) to be converted in analog form, while a base terminal of the second current steering transistor T2 is configured to receive the opposite of the digital signal Dout, i.e. an inverted digital signal Dout−. The collector terminal of the first current steering transistor T1 is structured to provide an analog current signal I+ representing the result of the digital-to-analog conversion of the digital signal Dout; the collector terminal of the second current steering transistor T2 is structured to provide the a further analog current signal I−, i.e. the result of the conversion of the inverted digital signal Dout−.

Moreover, the described embodiment of the digital-to-analog converter 3 also includes a shaping filter circuit comprising a shaping resistor $R_{DAC}$ connected in series to a shaping capacitor $C_{DAC}$ placed between an input inverter 15 and the anode of the diode 14. At the input inverter 15 a clock signal CLK can be fed.

Figure 4:
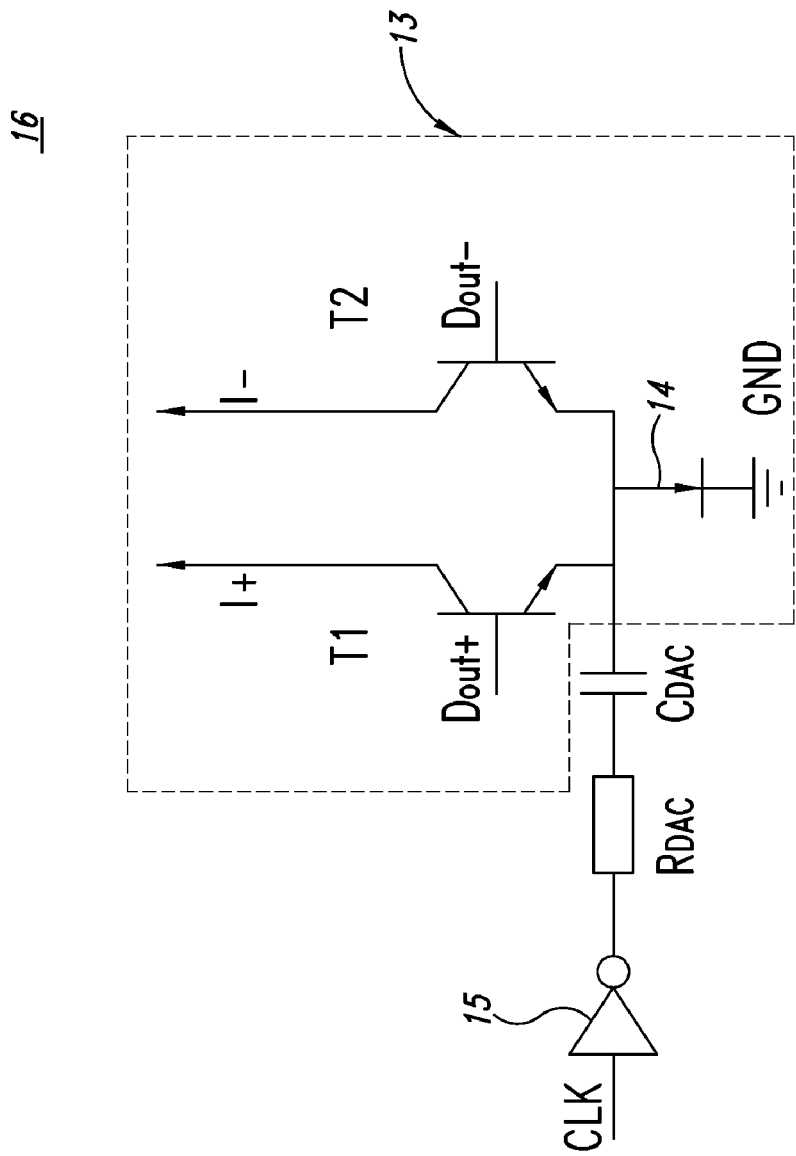
FIG. 4 shows an embodiment of a digital-to-analog converter employable by said continuous time sigma-delta analog-to-digital converter.

Particularly, the analog-to-digital converter 200 including the digital-to-analog converter 3 of FIG. 4 is designed to produce a digital signal Dout+/− having a high level which is several hundred mV (e.g. 500 mV) smaller than two times the diode forward voltage associated with diode 14, while the low level of the digital signal Dout+/− is an additional 200 mV smaller than the high level. This allows avoiding a quiescent current in the diode 14 and one of both first and second current steering transistors T1 and T2.

When the clock signal CLK assumes a low level, the signal exiting the input inverter 15 assumes a high level so charging the shaping capacitor $C_{ADC}$ via the shaping resistor $R_{DAC}$ and the diode 14 which is forward biased. In this situation, the first and second current steering transistors T1 and T2 are switched off. When the clock signal CLK assumes a high level, the signal exiting the input inverter 15 assumes a low level so allowing discharging of the shaping capacitor $C_{ADC}$ via the shaping resistor $R_{DAC}$ and one of the first and second current steering transistors T1 and T2. In the situation of a clock signal CLK having a high level, the voltage level associated with the digital signals Dout+/Dout− selectively switches off/on the first/second current steering transistors T1/T2 so generating a corresponding current pulse I+/I−.

The shaping resistor $R_{DAC}$ and the shaping capacitor $C_{DAC}$, defining a time constant $R_{DAC} C_{DAC}$, have a shaping effect which shapes the analog current pulse associated with the analog currents I+/I− to obtain either an exponential decaying shape if RDACCDAC<<1/fCLK or a nearly rectangular pulse if RDACCDAC>>1/fCLK. According to further examples, static high side current sources or a complementary high side structure can be added to the digital-to analog converter 16 to avoid residual static common mode currents.

To avoid distortion due to intersymbol interference, the transitions of the digital signal Dout+/Dout− are preferably timed during the low level of the clock signal CLK when both first and second current steering transistors T1 and T2 are switched off.

The one-bit return-to-zero converter 16 above described allows a large voltage swing at its output, while still providing a low noise output current due to the large degeneration via the shaping resistor $R_{DAC}$. Furthermore, the amount of charge that is injected is independent of the duty cycle of the clock signal CLK, because the charge that is stored in the shaping capacitor $C_{DAC}$ during the lowphase of the clock signal CLK is equal to the charge that is removed from the shaping capacitor $C_{DAC}$ during the clock high phase. This allows designing the ADC converter 200 with a loop gain which is fully independent from the duty cycle of the clock signal CLK.

In accordance with another example, the digital-to-analog converter 3 includes an additional one-bit return-to-zero converter analogous to the one described with reference to FIG. 4, driven by the same output digital signal Dout+/Dout− but adapted to be timed by another clock signal having opposite polarity of the clock signal CLK. In this case, the output current pulses I+/I− of the one-bit return-to-zero converter 16 and the additional one-bit return-to-zero converter are added. For a large time constant RDACCDAC>>1/fCLK the two combined return-to-zero converters are in this way equivalent to one non-return-to-zero converter. These and other changes can be made to the embodiments in light of the above-detailed description The described continuous time sigma-delta analog-to-digital converter allows employing operational amplifiers showing relaxed performances in comparison with the ones required by the sigma-delta analog-to-digital converter of the prior art.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

the invention claimed is:

1. A continuous time sigma-delta analog-to-digital converter comprising:
   a summer configured to provide a difference signal equal to a difference between an input analog signal and a feedback signal;
   a feed-forward integrator path connected to the summer and configured to provide a digital signal, the feed-forward integrator path including:
      an operational amplifier in an integrator configuration having:
         a first operational amplifier input electrically connected to the summer;
         a second operational amplifier input; and
         an operational amplifier output;
      a feedback capacitor having a terminal connected to the operational amplifier output; and
      an electrical link connecting another terminal of said feedback capacitor to the operational amplifier input;
   a feedback digital-to-analog converter configured to convert the digital signal into a feedback analog signal; and
   a feedback low pass filter structured to filter the feedback analog signal and provide the feedback signal to the summer.

2. The analog-to-digital converter of claim 1, wherein the feed-forward integrator path further includes:
   a low pass filter connected to the operational amplifier output; and a quantizer interposed between the low pass filter and a digital output for said digital signal.

3. The analog-to-digital converter of claim 1, wherein the electrical link includes a feedback resistor connected in series to the feedback capacitor so as to introduce a zero in a signal transfer function associated with the analog-to-digital converter.

4. The analog-to-digital converter of claim 1, wherein said feedback low pass filter is an RC filter and is configured to introduce a pole into a signal transfer function associated with the analog-to-digital converter.

5. The analog-to-digital converter of claim 4, wherein the feedback low pass filter comprises:
a filter capacitor placed between an output of the feedback digital-to-analog converter and a voltage reference; and
a filter resistor connected between the output of the feedback digital-to-analog converter and the summer.

6. The analog-to-digital converter of claim 5, wherein the feed-forward integrator path comprises:
a feedback resistor connected in series with the feedback capacitor between the operational amplifier output and input so as to introduce a zero in a signal transfer function associated with the analog-to-digital converter, wherein electrical parameters associated with the filter capacitor, the filter resistor, the feedback resistor and the feedback capacitor are designed to obtain a frequency associated with the pole equal to a frequency associated with the zero.

7. The analog-to-digital converter of claim 1, further comprising an input low pass filter configured to filter the input analog signal, associated with said summer, and connected to said feed-forward integrator.

8. The analog-to-digital converter of claim 7, wherein the input low pass filter comprises:
a first input resistor connected between a first terminal configured to receive the input analog signal and a second terminal;
a second input resistor connected between the second terminal and the first input of the operational amplifier;
a input capacitor connected between the second terminal and the second input of the operational amplifier.

9. The analog-to-digital converter of claim 8, wherein:
said feedback low pass filter is an RC filter, is configured to introduce a first pole into a signal transfer function associated with the analog-to-digital converter, and includes:
a filter capacitor placed between an output of the feedback digital-to-analog converter and a voltage reference, and
a filter resistor connected between the output of the feedback digital-to-analog converter and the summer;
the input low pass filter is configured to introduce a second pole into the signal transfer function associated with the analog-to-digital converter; and
the respective electrical parameters associated with the filter capacitor, the filter resistor, the first and second input resistors, and the input capacitor are selected to obtain the first pole equal to the second pole.

10. The analog-to-digital converter of claim 1, wherein the feedback digital-to-analog converter comprises:
a digital input coupled to receive said digital signal;
a current terminal configured to supply an analog current pulse corresponding to the feedback analog signal;
a current mode converter electrically connected to the digital input and the current terminal;
a timing input structured to receive a clock signal configured to drive said current mode converter; and
a shaping filter electrically connected between the timing input and the current mode converter and configured to shape said analog current pulse.

11. The analog-to-digital converter of claim 10, wherein the current mode converter comprises:
a differential pair circuit structured in a common emitter configuration;
a diode connected to a common emitter terminal of the differential pair circuit;
wherein the differential pair circuit is configured to be switched off/on by the clock signal.

12. The analog-to-digital converter of claim 11, wherein the shaping filter comprises:
a shaping resistor electrically connected to the timing input;
a shaping capacitor electrically connected to said shaping resistor and said diode;
wherein the feedback digital-to-analog converter is structured to cause the clock signal to charge said shaping capacitor in a first configuration and discharge said shaping capacitor in a second configuration and via said differential pair circuit to produce said analog current pulse.

13. The analog-to-digital converter of claim 11, wherein the differential pair circuit comprises:
a first transistor having:
a first control terminal connected to the digital input to receive said digital signal; and
a first output terminal connected to the current terminal to supply the analog current pulse;
a second transistor having:
a second control terminal configured to receive the opposite of said digital signal; and
a second output terminal to provide a further analog current pulse.

14. The analog-to-digital converter of claim 10, wherein the feedback digital-to-analog converter is a one-bit return-to-zero converter.

15. The analog-to-digital converter of claim 10, wherein the feedback digital-to-analog converter further includes an additional current mode converter electrically connected to the digital input and the current terminal.

16. The analog-to-digital converter of claim 1, wherein the analog-to-digital converter is realized according to a BiCMOS technology.

17. An electrical system comprising:
a continuous time sigma-delta analog-to-digital converter including:
an input terminal structured to receive an input analog signal and a feedback signal;
a feed-forward integrator path connected to the input terminal and configured to provide a digital signal, the feed forward integrator path having:
an operational amplifier in an integrator configuration, an input of the operational amplifier electrically connected to the input terminal; and
a feedback capacitor having a terminal connected to an output of the operational amplifier;
an electrical link connecting another terminal of said feedback capacitor to the input of the operational amplifier;
a feedback digital-to-analog converter configured to convert the digital signal into a feedback analog signal; and
a feedback low pass filter structured to filter the feedback analog signal and provide the feedback signal to the input terminal; and a processing apparatus connected to said analog-to-digital converter and configured to process the digital signal.

18. The electrical system of claim 17, wherein said a feedback low pass filter is an RC filter and is configured to introduce a pole into a signal transfer function associated with the analog-to-digital converter.

19. The electrical system of claim 17, wherein:
said electrical system is a car radio turner system, and
said apparatus comprises a demodulator of said digital signal.

20. A continuous time sigma-delta analog-to-digital converter comprising:
a summer configured to provide a difference signal equal to a difference between an input analog signal and a feedback signal;
a feed-forward integrator path connected to the summer and configured to provide a digital signal;
a feedback digital-to-analog converter configured to convert the digital signal into a feedback analog signal; and
a feedback low pass filter structured to filter the feedback analog signal and provide the feedback signal to the summer, wherein said feedback low pass filter is an RC filter and is configured to introduce a pole into a signal transfer function associated with the analog-to-digital converter.

21. The continuous time sigma-delta analog-to-digital converter of claim 20, wherein the feedback low pass filter comprises:
a filter capacitor placed between an output of the feedback digital-to-analog converter and a voltage reference; and
a filter resistor connected between the output of the feedback digital-to-analog converter and the summer.

22. The continuous time sigma-delta analog-to-digital converter of claim 21, wherein the feed-forward integrator path comprises:
an operational amplifier in a integrator configuration having:
an operational amplifier input electrically connected to the summer; and
an operational amplifier output,
a feedback capacitor having a terminal connected to the operational amplifier output; and
a feedback resistor connected in series with the feedback capacitor between the operational amplifier output and input so as to introduce a zero in a signal transfer function associated with the analog-to-digital converter, wherein electrical parameters associated with the filter capacitor, the filter resistor, the feedback resistor and the feedback capacitor are designed to obtain a frequency associated with the pole equal to a frequency associated with the zero.

23. A continuous time sigma-delta analog-to-digital converter comprising:
a summer configured to provide a difference signal equal to a difference between an input analog signal and a feedback signal;
a feed-forward integrator path connected to the summer and configured to provide a digital signal, the feed forward integrator path including:
an operational amplifier having first and second inputs and an output;
a feedback capacitor having a terminal connected to the operational amplifier output; and
an electrical link connecting another terminal of said feedback capacitor to the first input;
a feedback digital-to-analog converter configured to convert the digital signal into a feedback analog signal;

a feedback low pass filter structured to filter the feedback analog signal and provide the feedback signal to the summer; and
an input low pass filter configured to filter the input analog signal, associated with said summer, and coupled to said feed-forward integrator, wherein the input low pass filter comprises:
a first input resistor connected between a first terminal configured to receive the input analog signal and a second terminal;
a second input resistor connected between the second terminal and the first input of the operational amplifier; and
a input capacitor connected between the second terminal and the second input of the operational amplifier.

24. The continuous time sigma-delta analog-to-digital converter of claim 23, wherein:
said feedback low pass filter is an RC filter, is configured to introduce a first pole into a signal transfer function associated with the analog-to-digital converter, and includes:
a filter capacitor placed between an output of the feedback digital-to-analog converter and a voltage reference, and
a filter resistor connected between the output of the feedback digital-to-analog converter and the summer;
the input low pass filter is configured to introduce a second pole into the signal transfer function associated with the analog-to-digital converter; and
the respective electrical parameters associated with the filter capacitor, the filter resistor, the first and second input resistors, and the input capacitor are selected to obtain the first pole equal to the second pole.

25. A continuous time sigma-delta analog-to-digital converter comprising:
a summer configured to provide a difference signal equal to a difference between an input analog signal and a feedback signal;
a feed-forward integrator path connected to the summer and configured to provide a digital signal, wherein the feedback digital-to-analog converter includes:
a digital input coupled to receive said digital signal;
a current terminal configured to supply an analog current pulse corresponding to the feedback analog signal;
a current mode converter electrically coupled to the digital input and the current terminal;
a timing input structured to receive a clock signal configured to drive said current mode converter; and
a shaping filter electrically connected between the timing input and the current mode converter and configured to shape said analog current pulse;
a feedback digital-to-analog converter configured to convert the digital signal into a feedback analog signal; and
a feedback low pass filter structured to filter the feedback analog signal and provide the feedback signal to the summer.

26. The continuous time sigma-delta analog-to-digital converter of claim 25, wherein the current mode converter comprises:
a differential pair circuit structured in a common emitter configuration;
a diode connected to a common emitter terminal of the differential pair circuit; and
wherein the differential pair circuit is configured to be switched off/on by the clock signal.

27. The continuous time sigma-delta analog-to-digital converter of claim 25, wherein the feedback digital-to-analog converter is a one-bit return-to-zero converter.

28. An electrical system comprising:
a continuous time sigma-delta analog-to-digital converter including:
- an input terminal structured to receive an input analog signal and a feedback signal;
- a feed-forward integrator path connected to the input terminal and configured to provide a digital signal;
- a feedback digital-to-analog converter configured to convert the digital signal into a feedback analog signal; and
- a feedback low pass filter structured to filter the feedback analog signal and provide the feedback signal to the input terminal, wherein said a feedback low pass filter is an RC filter and is configured to introduce a pole into a signal transfer function associated with the analog-to-digital converter;

a processing apparatus coupled to said analog-to-digital converter and configured to process the digital signal.

29. The electrical system of claim 28 wherein the feedback digital-to-analog converter is a one-bit return-to-zero converter.

30. A car radio tuner system comprising:
a continuous time sigma-delta analog-to-digital converter including:
- an input terminal structured to receive an input analog signal and a feedback signal;
- a feed-forward integrator path connected to the input terminal and configured to provide a digital signal;
- a feedback digital-to-analog converter configured to convert the digital signal into a feedback analog signal, the feedback digital-to-analog converter including an additional current mode converter electrically connected to the digital input and the current terminal; and
- a feedback low pass filter structured to filter the feedback analog signal and provide the feedback signal to the input terminal;

a processing apparatus connected to said analog-to-digital converter and configured to process the digital signal, wherein said apparatus comprises a demodulator of said digital signal.

* * * * *